United States Patent
Wan

(10) Patent No.: US 6,768,194 B2
(45) Date of Patent: Jul. 27, 2004

(54) ELECTRODE FOR ELECTROPLATING PLANAR STRUCTURES

(75) Inventor: Kuo-Hui Wan, Hsin-Chu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 10/462,251

(22) Filed: Jun. 16, 2003

(65) Prior Publication Data

US 2003/0211674 A1 Nov. 13, 2003

Related U.S. Application Data

(62) Division of application No. 09/932,729, filed on Aug. 20, 2001, now Pat. No. 6,638,840.

(51) Int. Cl.[7] .......................... H01L 23/10; H01L 23/34
(52) U.S. Cl. ...................................... 257/707; 257/728
(58) Field of Search ................................ 257/707, 710, 257/713, 719, 728, 730

(56) References Cited

U.S. PATENT DOCUMENTS

| 4,389,296 | A | 6/1983 | Seyffert et al. ............ 204/206 |
| 5,236,566 | A | 8/1993 | Tsuchiya et al. ............ 204/206 |
| 5,833,820 | A | 11/1998 | Dubin ........................ 204/212 |
| 6,077,412 | A | 6/2000 | Ting et al. .................. 205/143 |
| 6,108,172 | A | 8/2000 | Hagen ..................... 360/245.2 |
| 6,132,587 | A | 10/2000 | Jorné et al. ................. 205/123 |

*Primary Examiner*—Phuc T. Dang
(74) *Attorney, Agent, or Firm*—George O. Saile; Stephen B. Ackerman

(57) ABSTRACT

An apparatus for electroplating a metal overlay on a substrate having a seed layer deposited on all surfaces. The apparatus includes a cell for containing and circulating an electrolyte and an annular sealing fixture having a "J" shaped cross section for supporting a peripheral front surface of the substrate. A multiplicity of compliant electrode fingers are inwardly mounted with a downward tilt angle. The compliant fingers make conductive cathodic contact with the seed layer at the peripheral edge of the substrate. A pressure is applied to the back surface of the substrate effecting a wiping action between the compliant fingers and the peripheral edge. A counter electrode is placed towards the bottom of the cell and is circuitous arranged for passing current between the counter electrode and compliant electrode fingers. A pump circulates the electrolyte against the front surface of the substrate.

18 Claims, 5 Drawing Sheets

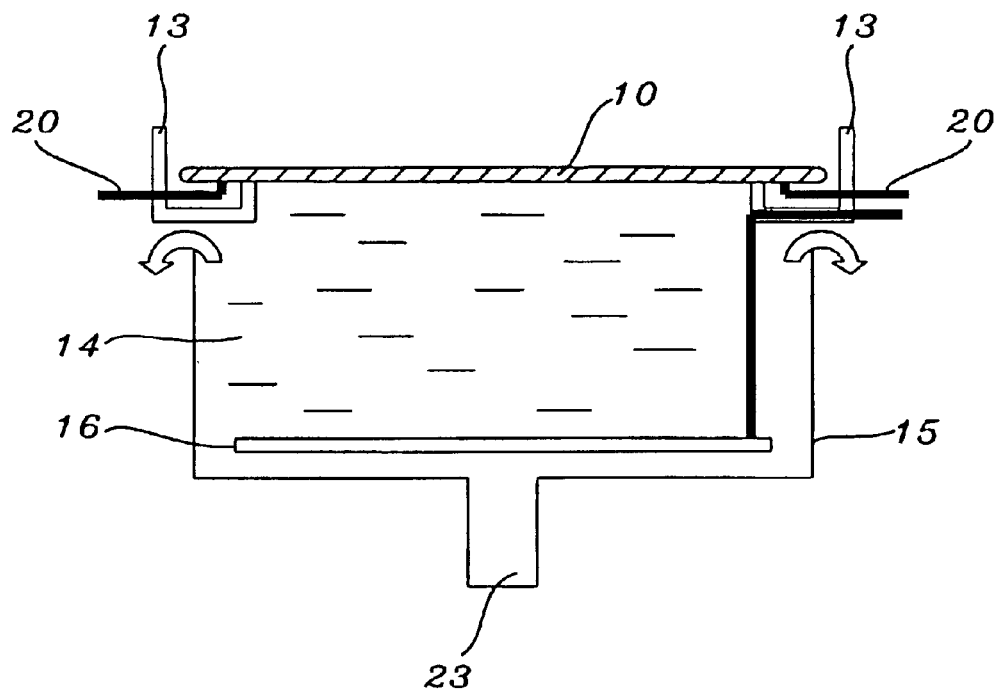
FIG. 1 — Prior Art
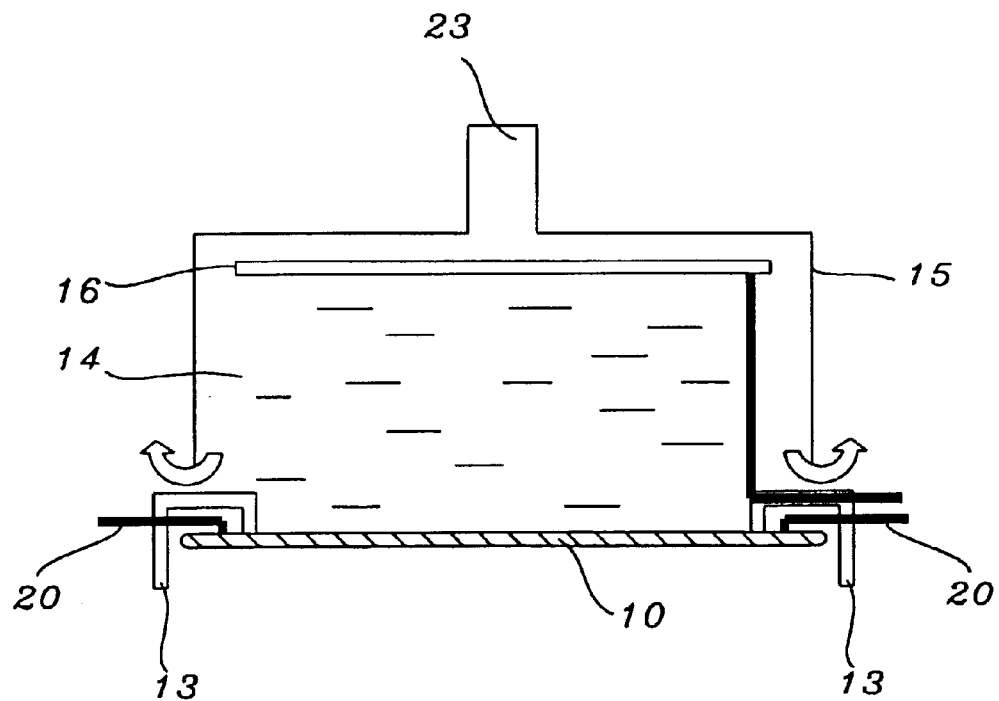
FIG. 2 — Prior Art

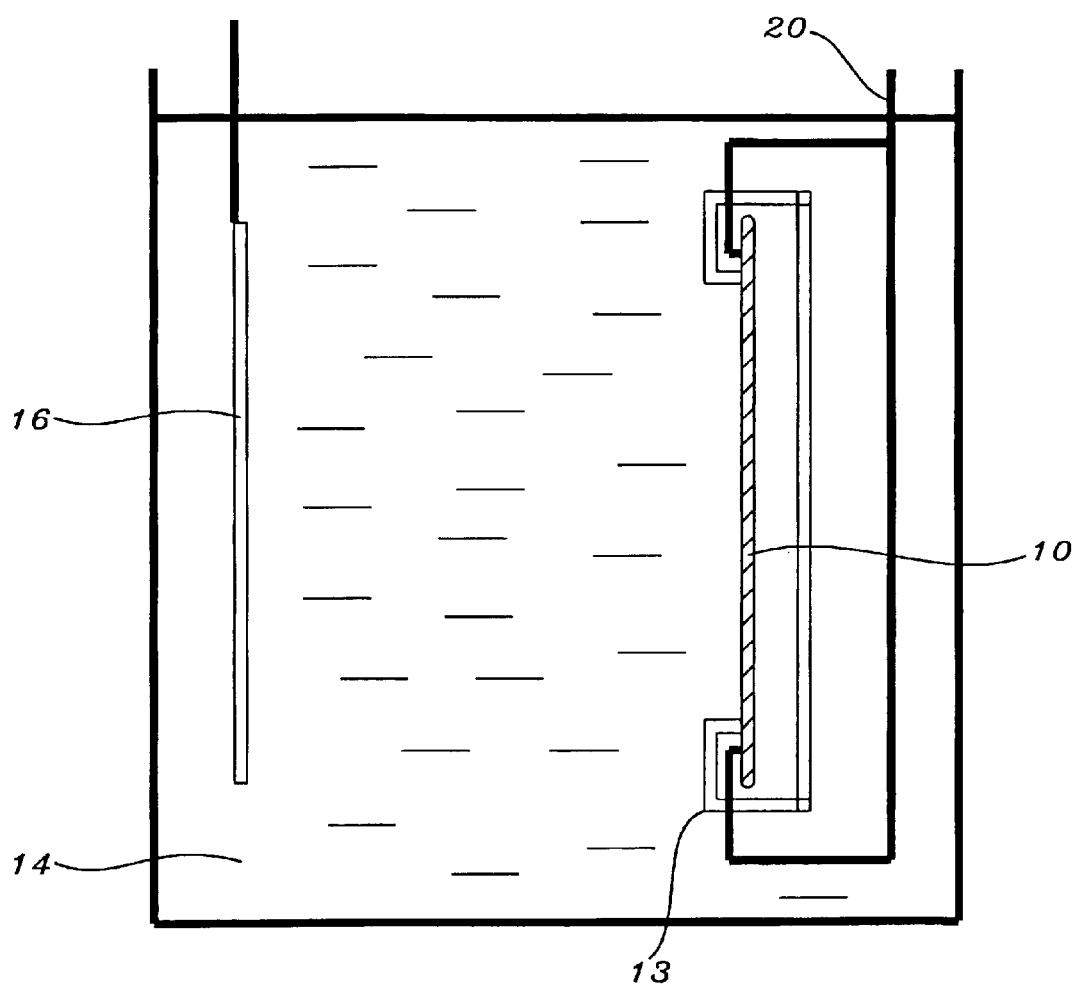
FIG. 3 – Prior Art

ELECTRODE FOR ELECTROPLATING PLANAR STRUCTURES

This is a division of patent application Ser. No. 09/932,729, filing date Aug. 20, 2001, now U.S. Pat. No. 6,638,840, An Electrode For Electroplating Planar Structures, assigned to the same assignee as the present invention.

BACKGROUND OF THE INVENTION (1) Technical Field

This invention relates to the field of semiconductor processing, and more particularly, to an electrode contact structure used for connecting to a substrate or wafer during electroplating (2) Description of the Prior Art The uniformity of depositing a metal layer onto wafer surfaces by electroplating is directly related to the contact resistance between a thin metal seed layer previously sputtered, and a cathode electrode.

In recent years, escalating requirements for high density and high performance have created the need for improved thickness uniformity.

There are considerable difficulties in the electroplating process in the context of a semiconductor substrate, including undesirable electroplating on the contact fingers, thereby generating contaminating particles, and unwanted electro-deposition of metal on the backside and edges of the substrate.

The following documents relate to various electroplating tools and processes.

U.S. Pat. No. 5,833,820 issued Nov. 10, 1998 to Valery Dubin discloses a tilt angle contact to a wafer in a plating tool.

U.S. Pat. Nos. 6,132,587 issued to Jorne at al.; 6,108,172 issued to Hagen; 6,077,412 issued to Ting et al; and 4,389,296 issued to Seyffert et al., show various plating tools and processes.

BACKGROUND OF THE RELATED ART

The present invention is concerned with conformal contact with a substrate to tolerate dimension variation of the plated substrate.

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. The size of interconnect structures will shrink correspondingly in order to accommodate the overall smaller dimensions. Thus, as integrated circuit technology advances into the sub-0.25 micron range, more advanced metallization techniques are needed to provide improvements over existing practices.

In order to fabricate features, circuits and devices on a substrate, such as a semiconductor wafer, various techniques are used to deposit and etch materials on the wafer. Deposition techniques include processes such as PVD, CVD, sputtering and immersion of the wafer in an electrolyte. The last technique can be used for either electroless deposition or electroplating.

In an electroplating technique, applicable to the current invention, the cells are tanks with sides and a bottom with a drain port on the bottom surface and an opening at the top which permits the substrate to be fully immersed in the electrolytic solution. The cell also includes a sealable top, or lid, per se, to hold the wafer in place and contain the electrolytic solution during immersion and/or inversion, minimizing leakage of the solution during the electroplating process. Once the substrate is immersed in an electrolyte, it is positioned in an electric field between a cathode and an anode, in which charged particles are deposited onto the surface of the substrate or wafer.

The present invention addresses the electroplating technique, in which a material is deposited on a substrate. The technique is implemented with a novel, contact electrode with a tilt angle permitting the described technique to be employed for the mass production of semiconductor products while eliminating some of the major manufacturing problems inherent in the process.

The current electroplating structures are limited by large area penalty and considerable backside and edge contamination problems.

There are many difficulties in the electroplating process in the context of a semiconductor substrate. Specifically, during electroplating, metallic fingers are used to provide electrical contact with a seed layer on a substrate. During the electroplating, metal from the electroplating solution is electroplated on the contact fingers, generating contaminating particles when the electroplated metal is delaminated from the contact fingers. In addition, electroplated metal on the contact fingers leads to increased contact resistance and can result in a high voltage drop and failure.

Another problem frequently encountered electroplating a metal on a substrate is the undesirable electro-deposition of metal on the backside and on the edges of the substrate.

SUMMARY OF THE INVENTION

This invention describes a device for a contact electrode with a tilt angle edge to tolerate dimension variations in the plated material.

An object of the tilt angle edged contact electrode structure is to allow for less area penalty when electroplating a metal on a substrate.

Another object of the invention is to offer a method to prevent metal plating on contacts during electroplating thereby reducing particulate contamination and improving thickness uniformity, and thus, performance.

Yet another object of the invention is the reduction in the possibility of backside and edge contamination during the process of plating metal on the front side of a substrate by preventing electro-deposition of metal on the backside and edges of the substrate.

Still another object of the invention is to provide for personalization of the electroplating process, thereby expanding both the limits and the customization capabilities of the electroplating process for many applications that current devices cannot accommodate.

When used in conjunction with photo resist, the invention expands the limits of the electroplating process and allows for personalization of the process for applications with special needs or inherent difficulties. A typical process includes:

(1) coating the substrate with a photo resist to limit or to personalize the electroplating.

(2) drying the photo resist.

(3) spray rinsing the edge of the wafer, with a photo resist solvent, to remove resist from the edge area, thereby, establishing a contact surface for the electrode.

(4) exposing and developing the photo resist for electroplating.

BRIEF DESCRIPTION OF THE DRAWINGS

FIG. 1 is a schematic drawing of the prior art showing the current practice of a face down electroplating cell.

FIG. 2 is a schematic drawing of the prior art showing the current practice of a face up electroplating cell.

FIG. 3 is a is a schematic drawing of the prior art showing the current practice of a horizontal electroplating cell.

DETAILED DESCRIPTION OF THE PREFERRED EMBODIMENT

Figure 4:
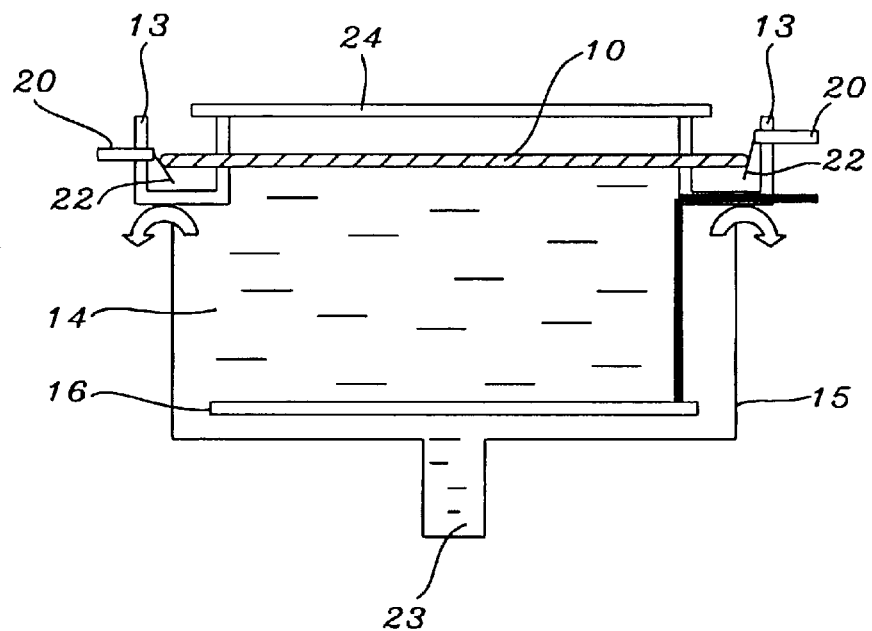
FIG. 4 is a schematic drawing of the preferred embodiment showing the practice of a face down electroplating cell.

The invention is designed to provide a new, tilt angle edge contact electrode structure for electroplating a metal on a substrate comprising a back side and a front side with a seed layer deposited on the front side.

The preferred embodiment's tilt angle edged contact electrode structure allows for less area penalty when electroplating a metal on a substrate.

The invention also offers a method to prevent metal plating on contacts during electroplating thereby reducing particulate contamination and improving thickness uniformity, and thus, performance.

And, the invention reduces the possibility of backside and edge contamination during the process of plating metal on the front side of a substrate by preventing electro-deposition of metal on the backside and edges of the substrate.

Importantly, the invention provides for personalization of the electroplating process, thereby expanding both the limits and the customization capabilities of the electroplating process for many applications that current devices cannot accommodate, e.g., for a post passivation process or redistribution metal process such as using Au or Cu on different wafer sizes.

Accordingly, an electrode apparatus for electroplating a metal overlay on a substrate having a front surface, a back surface, and a seed layer deposited on all surfaces. The apparatus includes a cell for containing and circulating an electrolyte, an annular sealing fixture having a "J" shaped cross section for supporting the peripheral front surface of the substrate. The substrate is supported above the cell by the shorter and inner member of the "J" shape. A multiplicity of compliant electrode fingers are inwardly mounted with a downward tilt angle, the compliant fingers are equally spaced about the inner periphery of the longer "J" member. The compliant fingers make conductive cathodic contact with the seed layer at the peripheral edge of the substrate. A pressure is applied to the back surface of the substrate. The pressure effects a wiping action between the compliant fingers and the peripheral edge while holding the substrate against the sealing fixture. A counter electrode is proximally placed towards the bottom of the cell and is circuitous arranged for passing current between the counter electrode and compliant electrode fingers. A pump circulates the electrolyte against the front surface of the substrate.

FIGS. 1 and 2 are schematic drawings of the electroplating cells, illustrating the current practices for face down and face up electroplating respectively. The face down electroplating cell 15 shown in FIG. 1, is a tank with sides and a bottom with a fill port on the bottom surface and an opening at the top which permits the front surface of a substrate to be exposed to the electrolytic solution. The cell also includes a sealable fixture 13, for supporting the substrate and for minimizing leakage of the solution during the electroplating process. The front surface of the substrate 10 is exposed to the electrolyte 14 and positioned in an electric field between a cathode 20 and an anode 16, in which charged particles are deposited onto the surface of the substrate 10. The sealing fixture 13 holds the substrate in place.

FIG. 3 illustrates the same process of the current practice for a vertical electroplating cell where the substrate is placed with its front surface against the sealing fixture, the fixture is placed vertically into the electrolyte and positioned in an electric field between a cathode 20 and an anode 16, in which charged particles are deposited onto the surface of the substrate 10.

Figure 5:
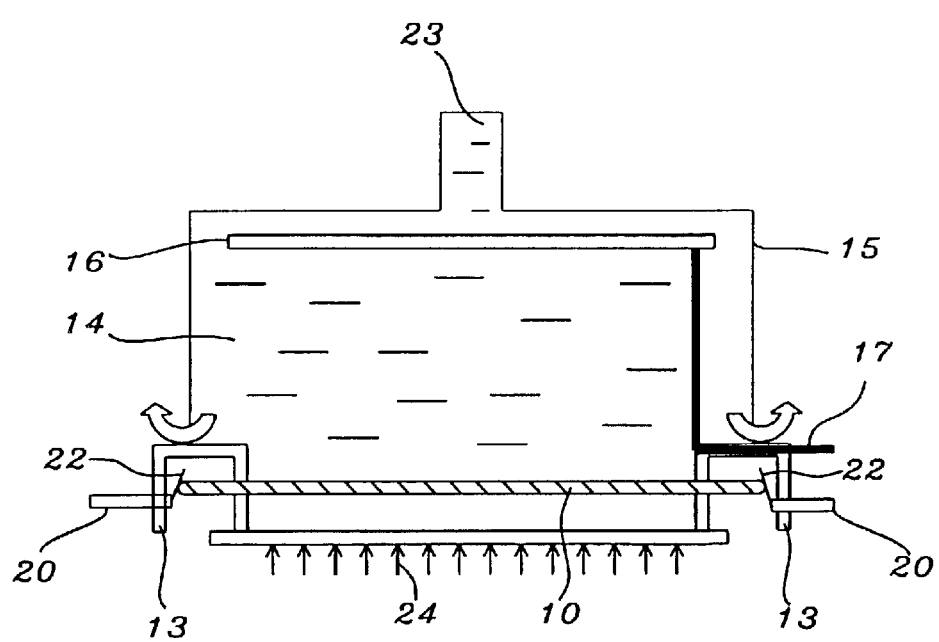
FIG. 5 is a schematic drawing of the preferred embodiment showing the practice of a face up electroplating cell.

FIGS. 4 and 5 are schematic drawings of an electroplating cell for selectively electroplating materials onto a metalized substrate 10 when the metalized substrate is subjected to an electrolytic solution 14 and an electric field.

Referring to FIGS. 4 and 5 showing schematic drawings of the preferred embodiment for a face down and face up electroplating respectively. FIG. 4 illustrates a face down electroplating cell 15, embodying sides and a bottom with a fill port 23 on the bottom surface and an opening at the top which permits the front surface of a substrate to be fully exposed to an electrolytic solution 14. The cell also includes an annular sealing fixture 13 mounted on top which supports and seals the front surface of an object or substrate, per se, held in place by a pressure fixture 24, which is urged against the back surface, which serves to hold the substrate in place and contain the electrolytic solution during immersion, minimizing egress of the solution during the electroplating process. FIGS. 4 and 5 showing the substrate 10 in the electrolyte cell 15 with electrolyte 14 and illustrates electrode fingers 11, each with a tilt angle for making wiping contact between the first end of a contact finger and the peripheral edge of the substrate which has a conductive seed layer previously applied to all surfaces of the substrate. The material of the electrode fingers 22 is a compliant yielding metal and may take the form, for example, of a titanium metal finger having a PT coating, or, alternatively, this finger may be a simple titanium wire.

The contact electrode includes a plurality of spring-loaded contacts 22, so contact is made at multiple sites and pressure holds the substrate 10 in place. The electrical contact resistance is reduced because of the wiping action between the seed layer at the edge of the substrate and the compliant electrode fingers.

Figure 6:
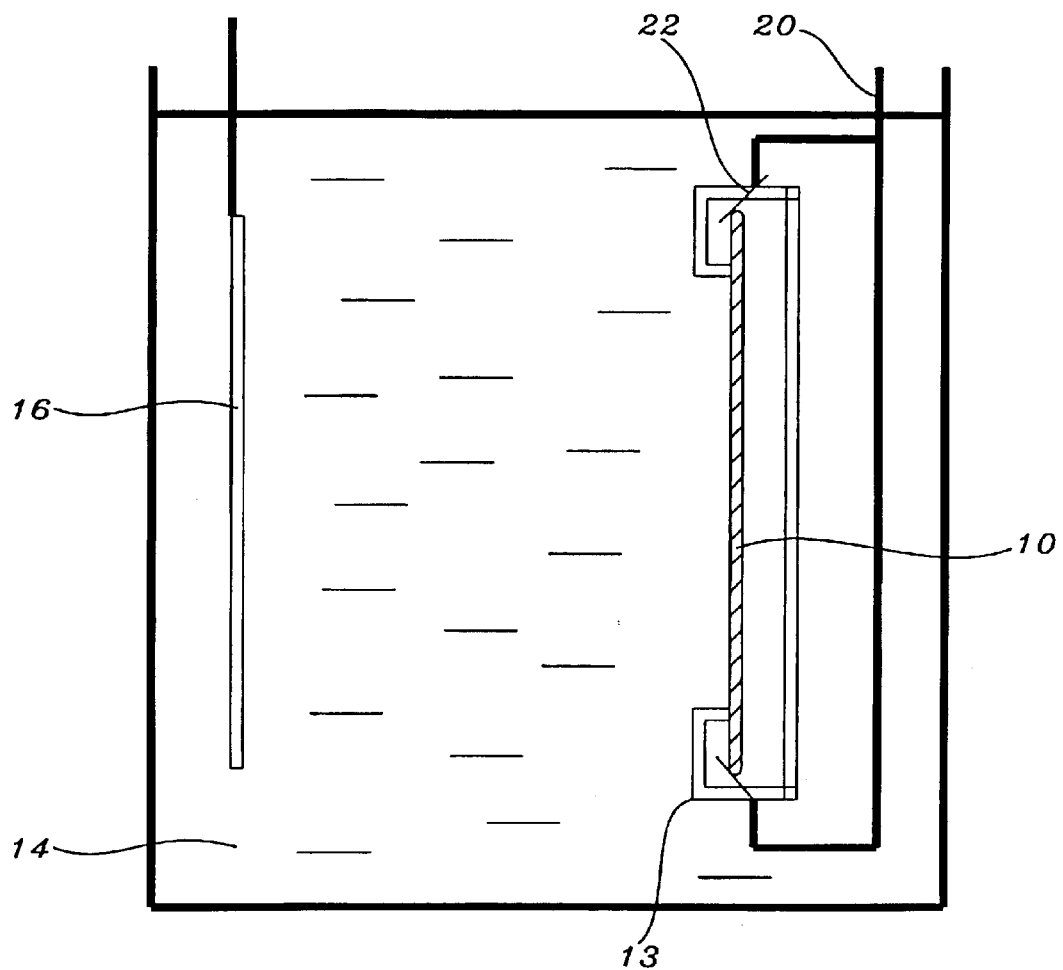
FIG. 6 is a schematic drawing of the preferred embodiment showing the practice of a horizontal electroplating cell.

FIG. 6 deals with the same process of the preferred embodiment for a horizontal electroplating cell.

Figure 7:
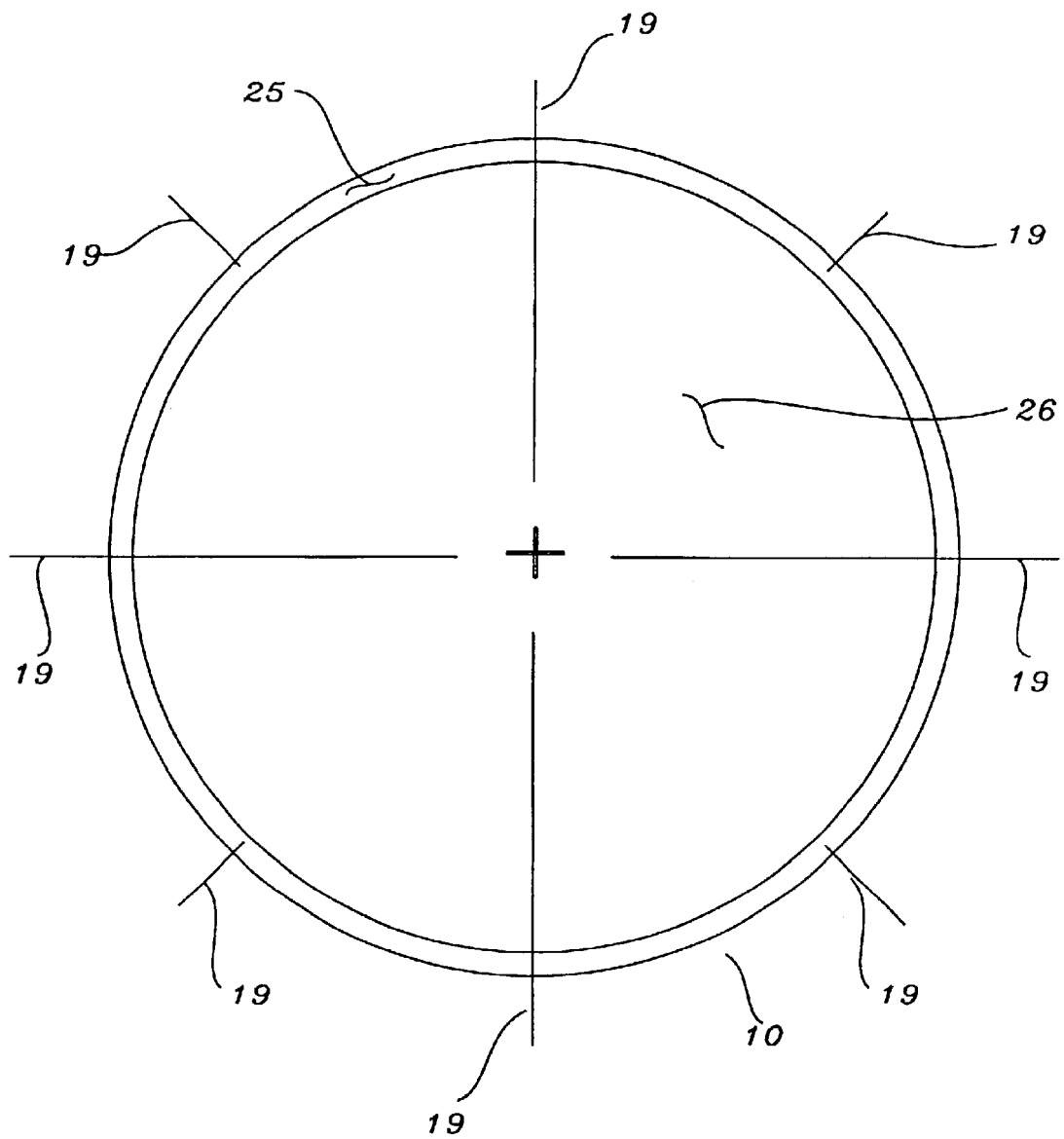
FIG. 7 is an illustration of the invention showing the contact points around the periphery of the substrate.

FIG. 7 shows the front face of the substrate 10 to illustrate the contact of a multiplicity of complaint electrode fingers 19 with the exposed seed layer 25 around the periphery of the substrate 10 and photo resist 26 masking the personalized area not to be electroplated.

Reiterating the description of the electrode apparatus used primarily for electroplating a metal overlay on a substrate 10 having a front surface, a back surface, and a seed layer deposited on all surfaces. The apparatus includes a cell 15 for containing and circulating an electrolyte 14, an annular sealing fixture 13 having a "J" shaped cross section for supporting the peripheral front surface of the substrate. The substrate 10 is supported above the cell 15 by the shorter and inner member of the "J" shaped sealing fixture 13. A multiplicity of compliant electrode fingers 22 are inwardly mounted with a downward tilt angle, the compliant fingers 22 are equally spaced about the inner periphery of the longer "J" member. The compliant fingers make conductive cathodic contact with the seed layer at the peripheral edge of the substrate 10. A pressure is applied to the back surface of the substrate. The pressure effects a wiping action between the compliant fingers and the peripheral edge while holding the substrate 10 against the sealing fixture 13. A counter electrode 16 is proximally placed towards the bottom of the cell 15 and is circuitous arranged for passing current between the counter electrode 16 and compliant electrode fingers 22. A pump (not shown) circulates the electrolyte against the front surface of the substrate.

While the invention has been particularly shown and described with reference to the preferred embodiment, it will be understood by those skilled in the art that various changes in form and details may be made without departing from the spirit and scope of the inventions.

What is claimed is:

1. An electrode apparatus for electroplating a metal overlay on a substrate having a front surface, a back surface, and a seed layer deposited on all surfaces, said electrode apparatus comprising:

a cell means for containing and circulating an electrolyte;

an annular sealing fixture having a "J" shaped cross section for supporting the peripheral front surface of said substrate, said substrate is supported above said cell means by the shorter and inner member of said "J" shape;

a plurality of compliant electrode fingers inwardly mounted with a downward tilt angle, said pluralily of compliant electrode fingers are equally spaced about the inner periphery of said longer "J" member, said compliant electrode fingers make conductive cathodic contact with said seed layer at the peripheral edge of said substrate thereby tolerating dimensional variations of the substrate and reducing large area complexities;

a pressure means supplied to the back surface of said substrate, said pressure means effects a wiping action between said compliant electrode fingers and the peripheral edge while holding said substrate against said sealing fixture.

2. Apparatus of claim 1 and further comprising:

a counter electrode proximally placed in the bottom of said cell means;

means arranged for passing current between said counter electrode and said compliant electrode fingers;

a pump means for supplying electrolyte against said front surface of said substrate.

3. The apparatus according to claim 1 wherein said seed layer is a sputtered conductive metal layer covering the substrate.

4. The apparatus according to claim 1 wherein said plurality of compliant fingers are made of a flexible conductive metal.

5. The apparatus according to claim 1 wherein the downward tilt angle renders a gentle pressure component to the peripheral edge of said substrate during the wiping action, therein, reducing the contact resistance between said compliant fingers and said seed layer.

6. The apparatus according to claim 1 wherein said tilt angle of said compliant fingers endures dimensional variation of plated layers.

7. An apparatus for electroplating a metal overlay on a substrate having a front surface, a back surface, and a seed layer deposited on all surfaces, said electrode apparatus comprising:

a cell means for containing and circulating an electrolyte;

an annular sealing fixture having an inverted "J" shaped cross section for supporting the peripheral front surface of said substrate, said substrate is supported below said cell means by the shorter and inner member of said "J" shape;

a plurality of compliant electrode fingers inwardly mounted with an upward tilt angle, said plurality of compliant electrode fingers are equally spaced about the longer "J" member, said compliant electrode fingers make conductive cathodic contact with said seed layer at the peripheral edge of said substrate, thereby tolerating dimensional variations of the substrate;

a pressure means applied to the back surface of said substrate, said pressure means effects a wiping action between said compliant electrode fingers and the peripheral edge while holding said substrate up against said sealing fixture.

8. Apparatus of claim 7 and further comprising:

a counter electrode placed within cell means;

means for filling said cell means with an electrolyte;

means arranged for passing current between said counter electrode and the substrate complying electrode members.

9. The apparatus according to claim 7 wherein said seed layer is a sputtered conductive metal layer covering the substrate.

10. The apparatus according to claim 7 wherein said plurality of compliant fingers are made of a flexible conductive metal.

11. The apparatus according to claim 7 wherein the downward tilt angle renders a gentle pressure component in the peripheral edge of said substrate during the wiping action, therein, reducing the contact resistance between said compliant fingers and said seed layer.

12. The apparatus according to claim 7 wherein said tilt angle of said compliant fingers endures dimensional variation of plated layers.

13. An electrode apparatus for electroplating a metal overlay on a substrate comprising a front surface, a back surface, and a seed layer deposited on all surfaces, said electrode apparatus comprising:

a cell means for containing an electrolyte;

an annular sealing holder adapted to vertically hold said substrate exposing only its front surface to said electrolyte while immersed in said cell means, said annular sealing fixture having a "J" shaped cross section for supporting the peripheral front surface of said substrate, said substrate is vertically contiguous the shorter "J" member;

a plurality of compliant fingers inwardly mounted with a tilt angle, said plurality of compliant fingers are equally spaced about the inner periphery of said longer "J" member, said compliant fingers make conductive contact with said seed layer at the peripheral edge of said substrate, thereby tolerating dimensional variations of the substrate;

a pressure means applied to the back surface for holding said substrate against said sealing fixture, said pressure means effects a wiping action between said compliant fingers and the peripheral edge while holding the substrate against said sealing fixture.

14. Apparatus of claim 13 and further comprising:

a counter electrode placed within cell means;

means for filling said cell means with an electrolyte;

means arranged for passing current between said counter electrode and the compliant electrode fingers.

15. The apparatus according to claim 13 wherein said seed layer is sputtered conductive metal layer covering the substrate.

16. The apparatus according to claim 13 wherein said plurality of compliant fingers are made of a flexible conductive metal.

17. The apparatus according to claim 13 wherein the downward tilt angle renders a gentle pressure component to the peripheral edge of said substrate during the wiping action, therein, reducing the constant resistance between said compliant fingers and said seed layer.

18. The apparatus according to claim 13 wherein said tilt angle of said compliant fingers endures dimensional variation of plated layers.

* * * * *

UNITED STATES PATENT AND TRADEMARK OFFICE
CERTIFICATE OF CORRECTION

PATENT NO. : 6,768,194 B2
APPLICATION NO. : 10/462251
DATED : July 27, 2004
INVENTOR(S) : Kuo-Hui Wan It is certified that error appears in the above-identified patent and that said Letters Patent is hereby corrected as shown below:

In Column 4, Line 38, Replace "fingers 11", with --fingers 22--.

In Claim 1, at Column 5, Line 39, Replace "a pressure means supplied to", with --a pressure means applied to--.

Signed and Sealed this
Twelfth Day of February, 2013

Teresa Stanek Rea
*Acting Director of the United States Patent and Trademark Office*